(12) United States Patent
Bae

(10) Patent No.: US 6,331,377 B2
(45) Date of Patent: *Dec. 18, 2001

(54) METHOD FOR FABRICATING SEMICONDUCTOR DEVICE

(75) Inventor: Ki-Soon Bae, Seoul (KR)

(73) Assignee: Samsung Electronics Co., Ltd. (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/300,895

(22) Filed: Apr. 28, 1999

(30) Foreign Application Priority Data

Apr. 28, 1998 (KR) .................................. 98-15070

(51) Int. Cl.$^7$ ........................................................ G03F 7/00
(52) U.S. Cl. ........................................... 430/313; 430/317
(58) Field of Search ................................... 430/311, 319, 430/312, 313, 316, 317, 394, 396

(56) References Cited

U.S. PATENT DOCUMENTS

| | | | |
|---|---|---|---|
| 5,357,311 | * 10/1994 | Shiraishi | 355/53 |
| 5,362,666 | * 11/1994 | Dennison | 437/52 |
| 5,558,963 | * 9/1996 | Tsudaka et al. | 430/22 |
| 5,641,609 | * 6/1997 | Nishimoto | 430/313 |
| 5,723,235 | * 3/1998 | Tsudaka et al. | 430/5 |
| 5,731,131 | * 3/1998 | Momma et al. | 430/311 |
| 5,736,300 | * 4/1998 | Mizuno et al. | 430/313 |
| 5,858,622 | * 1/1999 | Gearhart | 430/315 |
| 5,900,349 | * 5/1999 | Han | 430/311 |
| 5,928,838 | * 7/1999 | Takeshita | 430/311 |
| 5,945,256 | * 8/1999 | Kim et al. | 430/312 |
| 6,027,865 | * 2/2000 | Andoh | 430/396 |

FOREIGN PATENT DOCUMENTS 97-76069   12/1997   (KR) .

\* cited by examiner

Primary Examiner—Kathleen Duda
(74) Attorney, Agent, or Firm—Myers Bigel Sibley & Sajovec

(57) ABSTRACT

There is provided a method for fabricating a semiconductor device in which a plurality of adjacent contacts are formed on a plurality of regions having the same layout. The layout is divided into at least two groups, and the contacts are formed on the regions by using masks which are designed to have different sizes from each other by the group. By differentiating the mask sizing factor of the contact pattern by the group on the mask, it is possible to minimize the problem that the contact is not opened at the region where a global step difference on a wafer is significant and to enhance a process margin of photolithography.

5 Claims, 6 Drawing Sheets

METHOD FOR FABRICATING SEMICONDUCTOR DEVICE

FIELD OF THE INVENTION

The present invention relates to a method for fabricating a semiconductor device, and more particularly, to a semiconductor device fabricating method which can minimize a contact defect due to a global step difference on a wafer and secure a process margin of photolithography for forming a contact.

BACKGROUND OF THE INVENTION

With the higher integration of dynamic random access memory (DRAM) devices, it has been demanded to reduce a unit cell size. The most significant problem raised by the reduction in the cell size is to secure the capacitance of a capacitor. To secure the capacitance of the capacitor, various methods have been proposed, such as a method of reducing the thickness of a dielectric layer, a method of using a dielectric layer made of materials with high dielectric constant or a method of increasing the size of a storage electrode. Particularly, for an increase in the capacitance of the capacitor, the structure of the capacitor has been changed from an early plane structure to a stack- or trench-type structure. Further, in the stacked type capacitor structure, a technique has been changed to a cylinder-type capacitor structure or a fin-type capacitor structure to increase the valid area of the storage electrode.

Considering these technical changes in the light of a processing sequence, change has been made from a capacitor-under-bit line (hereinbelow referred to as a "CUB") structure in which a capacitor is formed prior to the formation of the bit line, to a capacitor-over-bit line (hereinbelow referred to as a "COB") structure in which a capacitor is formed after the formation of the bit line. The COB structure has an advantage over the CUB structure in that the capacitor can be formed regardless of the margin for a bit line forming process, thus increasing the capacitance of the capacitor in a limited area. That is, since the capacitor is formed over the bit line in the COB structure, the size of the storage electrode can be maximized to the limit of photolithography, enabling the formation of a capacitor with greater capacitance. However, in such a COB structure, the storage electrode of the capacitor is formed only at a memory cell region, thus increasing a global step difference on a wafer. That is, the absolute heights of a memory cell region where the capacitor is to be formed, a core region consisting of circuits for driving cells and a peripheral circuit region are different to one another, and this causes the reduction in a process margin of the photolithography for forming a metal contact.

FIGS. 1 to 3 are cross-sectional views for explaining a metal contact forming method of a DRAM device according to the prior art.

Referring now to FIG. 1, a field oxide film 12 is formed on a semiconductor substrate 10, dividing the substrate 10 into an active region and a device isolation region. Subsequently, a first conductive layer 14 is deposited over the substrate 10, patterned by photolithography, thus forming a gate electrode of a transistor acting as a word line. And then, source and drain regions (not shown) of the transistor are formed on the surface of the active regions at both sides of the gate electrode 14.

After a first insulating layer 16 made of an insulating material like oxide is formed over the substrate 10 on which the transistor has been formed, the first insulating layer 16 is etched by photolithography, to form a bit line contact (not shown) to expose the drain region. Next, a second conductive layer 18 is deposited on the first insulating layer 16 containing the bit line contact and patterned by photolithography, thus forming a bit line which is connected to the drain region of the transistor via the bit line contact. A second insulating layer 20 made of an insulating material like BPSG (Boron-Phosphorus Silicate Glass) is formed on the second conductive layer 18. The second insulating layer 20 serves to insulate the bit line from a storage electrode (not shown) of the transistor which is to be formed in a subsequent process, and for the planarization of the surface of the second insulating layer 20, a flow process, an etch-back process or a chemical mechanical polishing (CMP) process is executed. Though not shown, the storage electrode of the transistor, a dielectric layer and a plate electrode are sequentially formed over the second insulating layer 20. Next, to form a metal wiring of the active region (i.e., source/drain regions) and conductive layers, a photoresist 22 is formed over the whole surface of the resultant structure on which the capacitor has been formed. In a COB structured DRAM device, a vertical step difference among the memory cell region, a core region and a peripheral circuit region has already been formed due to the word line 14 and the bit line 18 before the capacitor is formed, so that even though the planarization is processed after the second insulating layer 20 is formed, it is impossible to remove the step difference of its lower structure. Hence, the thickness of the photoresist 22 varies by the area of the metal contact, as shown in FIG. 1.

Referring to FIG. 2, the photoresist 22 is patterned by light-exposing and developing processes, thus forming a photoresist pattern 22a to open a metal contact region. Here, since the thickness of the photoresist 22 varies by the area of the metal contact as described above, in the case of placing a focus on the d, e and f-contact regions during the light-exposing process, the a and b-contact regions become out of focus and thus the critical dimensions (CD) of the a and b-metal contacts become reduced in the subsequent etching process.

Now, referring to FIG. 3, the second insulating layer 20 and the first insulating layer 16 are etched by using the photoresist patterns 22a as an etching mask, thus forming metal contact holes 24. In this case, since the thickness of the photoresist 22 varies by the area of the metal contact, the critical dimension of the metal contact varies over 100 nm by the area of the metal contact due to the focus defect caused by the global step difference on the wafer during the etching process. That is, the critical dimension of the metal contact is gradually varied to the range of 100 to 200 nm or to be over 20% of a mean size of the contacts. Due to the variation of the critical dimension, there may occur a problem that the metal contact of small size is not opened, and in the case of increasing the size of all metal contacts to solve this problem, this generates another problem of causing a short between the word line 14 and the metal contact and reducing the overlap margin between the bit line 18 and the metal contact.

FIG. 4 is a graph showing the variation of the critical dimension (CD) of the metal contact according to the thickness ($T_{PR}$) of the photoresist. From this graph, it is apparent that the critical dimension of the metal contact is reduced with the increase in the thickness ($T_{PR}$) of the photoresist.

FIG. 5 is a graph showing the variation of the critical dimension of the metal contact according to the thickness of the photoresist which varies by the area of the metal contact.

Here, a split wordline driver(SWD) region, a sense amplifier (S/A) region connected to each bit line, for amplifying a signal read from a cell, and a conjunction region for connecting blocks of the cell are the core region. And a row decoder (R/D) and a column decoder (C/D), each having a plurality of input terminals and a plurality of output terminals, are the peripheral circuit region. According to FIG. 5, S/A ACT(ACTIVE) refers to a sense amplifier active region; S/A B/P to a sense amplifier bitline poly region; S/A GP to a sense amplifier gate poly region; S/A EO to a sense amplifier equalizer region; SWD to a split wordline driver region; and CONJ to a conjunction structure.

Referring to FIG. 5, the critical dimension of the split wordline driver region where the distance between cells is the shortest is about 300 nm, that of the sense-amplifier region is about 400 nm, that of the conjunction region is about 500 nm and that of the peripheral circuit region is about 600 nm. That is, the critical dimension of the metal contact is increased in the sequence of the split wordline driver region, the sense amplifier region, the conjunction region and the peripheral circuit region.

Further, since the critical dimension is varied according to the distance from the cell even in the same core region, there exists almost no process margin for the photolithography in the case of the first metal contacts formed at the region closest to the memory cell region, and this causes a contact defect and further a problem that the contact is not opened.

SUMMARY OF THE INVENTION

Accordingly, an object of the present invention is to provide a method for fabricating a semiconductor device which can minimize a contact defect due to a global step difference on a wafer and secure a process margin of photolithography for forming the contact, to solve the problems depicted above.

Another object of the present invention is to provide a method for fabricating a DRAM device which can minimize the defect of a metal contact due to a global step difference on a wafer and secure a process margin of photolithography for forming the metal contact.

To achieve the above object, there is provided a method for fabricating a semiconductor device in which a plurality of adjacent contacts are formed on a plurality of regions having the same layout. The method has the steps of dividing the layout into at least two groups and forming the adjacent contacts on the regions by using masks which are designed to have different sizes from each other by the group.

It is preferred that a plurality of adjacent contacts in one of two groups are designed to have different sizes from each other on the mask.

To achieve another object of the present invention, there is provided a method for fabricating a dynamic random access memory device having a memory cell region, a core region for driving cells and a peripheral circuit region. The method is characterized in that a plurality of adjacent contacts are formed on the memory cell region, the core region and the peripheral circuit region by using masks which are designed to have different sizes from each other by the region.

It is preferred that the metal contacts to be formed on the core region are designed to have different sizes from each other on the mask.

It is preferred that first metal contacts placed at a region closest to the memory cell region of the core region are designed to have different size from the metal contacts placed at the remaining regions of the core region on the mask.

BRIEF DESCRIPTION OF THE DRAWINGS

The foregoing and other objects, features and advantages of the present invention will become more apparent from the following detailed description when taken in conjunction with the accompanying drawings in which.

DETAILED DESCRIPTION OF THE PREFERRED EMBODIMENTS

Reference will now be made in detail to the preferred embodiments of the present invention.

Figure 1:
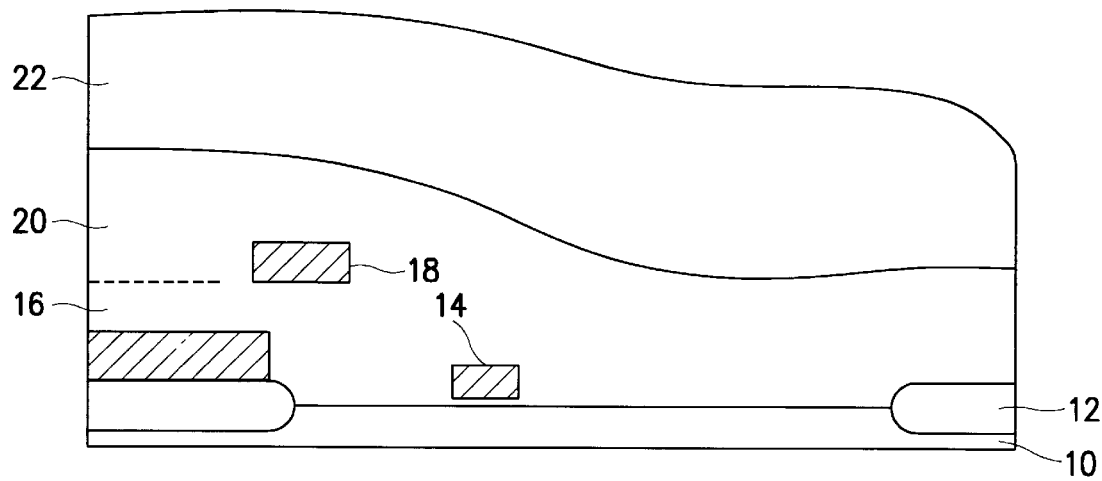
FIGS. 1 to 3 are cross-sectional views for explaining a metal contact forming method of a semiconductor device according to the prior art.
Figure 2:
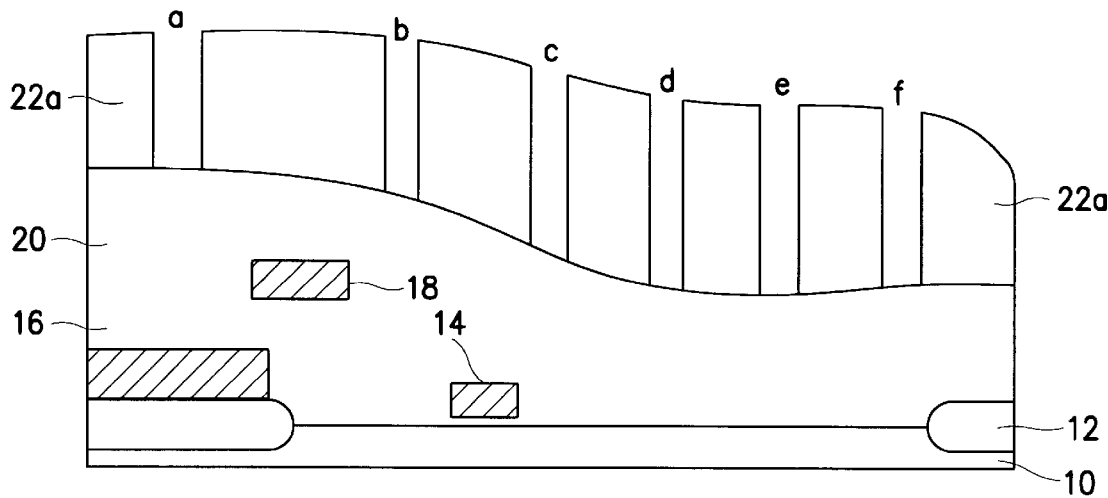
Figure 3:
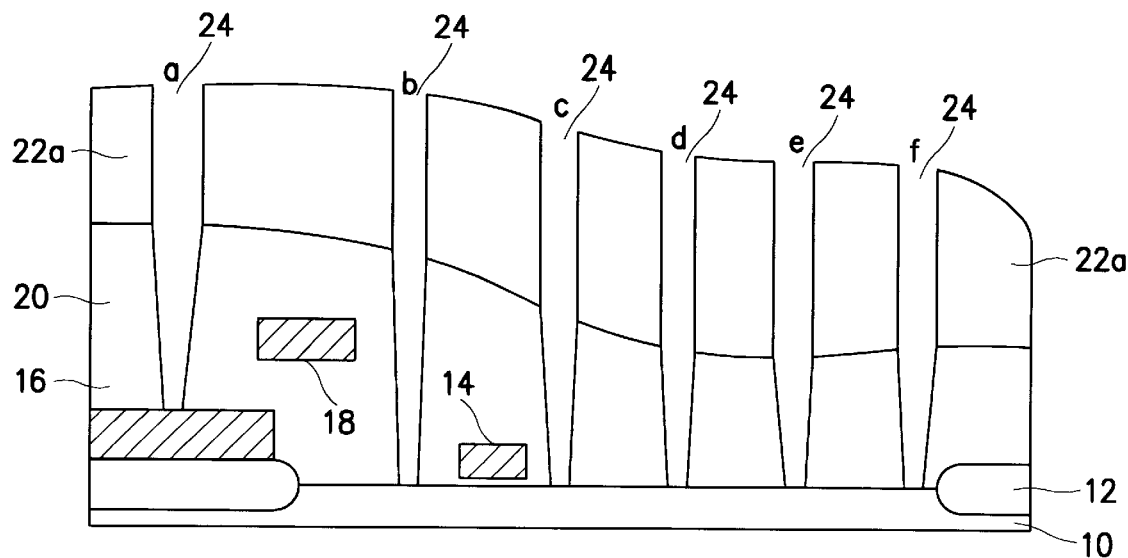
Figure 4:
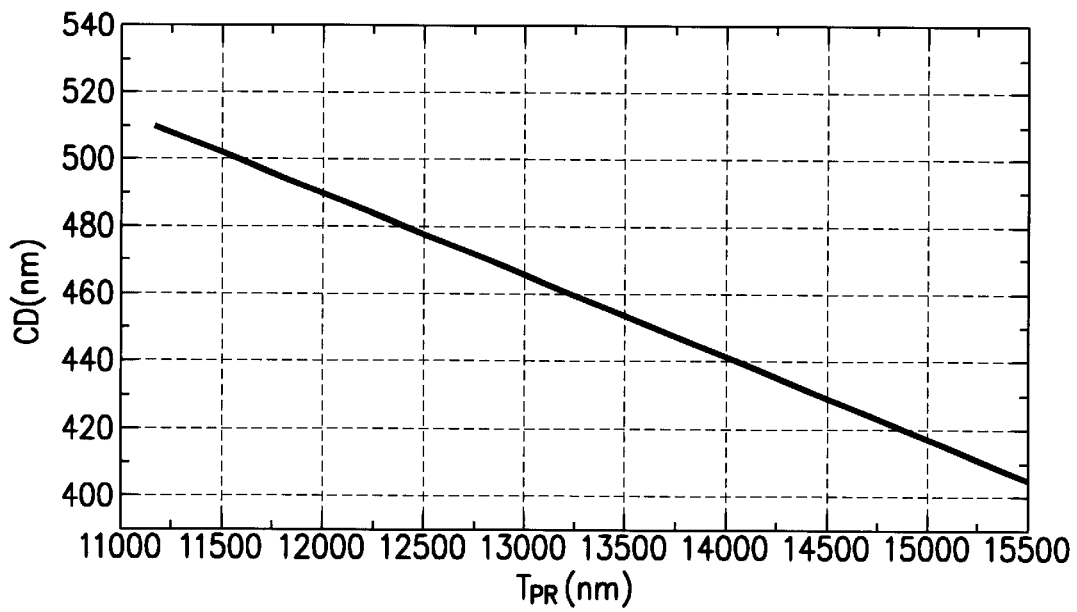
FIG. 4 is a graph showing the variation of a critical dimension of a metal contact according to the thickness of a photoresist.
Figure 5:
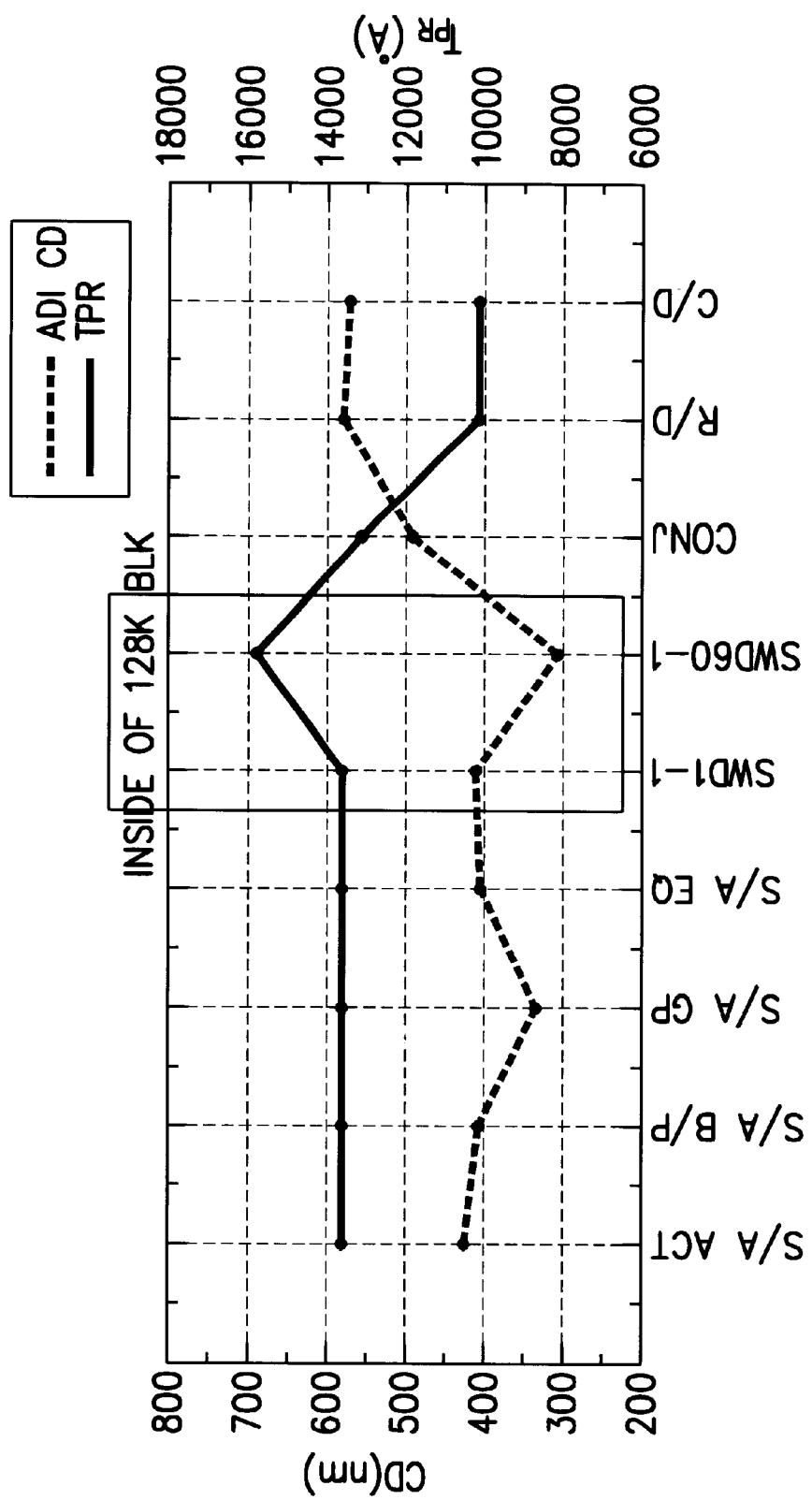
FIG. 5 is a graph showing the variation of a critical dimension of a metal contact according to the thickness of a photoresist which varies by the area of the metal contact.
Figure 6:
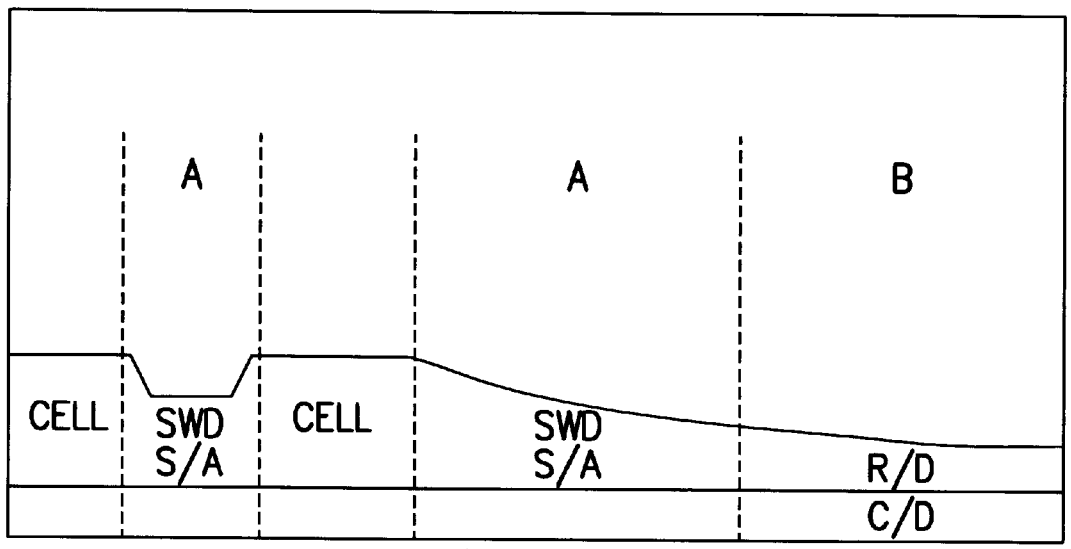
FIG. 6 is a cross-sectional view of a semiconductor device according to a preferred embodiment of the present invention.

FIG. 6 is a cross-sectional view of a DRAM device according to a preferred embodiment of the present invention, showing a memory cell region (cell), a core region (SWD, S/A) and a peripheral circuit region (R/D, C/D).

Referring to FIG. 6, to solve the problem of reduction in the process margin of photolithography for forming a metal contact due to a global step difference on a wafer, the core region adjacent to the memory cell region is classified as a group A and the peripheral circuit region as a group B, thus differentiating the mask sizing factor of the metal contacts formed at the groups A and B. The group A is affected by the step difference between the memory cell region and the core region, and the group B is affected by the step difference between the core region and the peripheral circuit region. Hence, the metal contacts formed at the group A where there often occurs a contact defect, are designed to have larger size than the metal contacts formed at the group B on the mask, by over sizing the metal contacts formed at the group A. If the photolithography for forming the metal contact is executed by using such a mask, the exposure at the group A where the size of the metal contact is relatively large, is more intensive than at the group B, and thus it is possible to obtain a good profile of the photoresist at the core region (group A) adjacent to the memory cell region. Hence, the metal contact can be formed without any contact defect at the core region adjacent to the memory cell region and practically, the sizes of the metal contacts formed at the memory cell region, the core region (group A) and the peripheral circuit region (group B) become uniform on the wafer.

Figure 7:
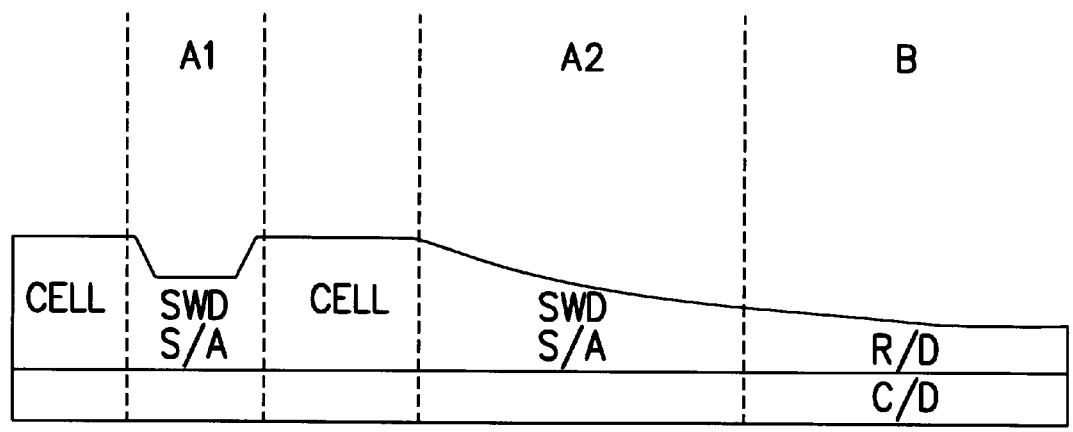
FIG. 7 is a cross-sectional view of a semiconductor device according to another preferred embodiment of the present invention.
Figure 8:
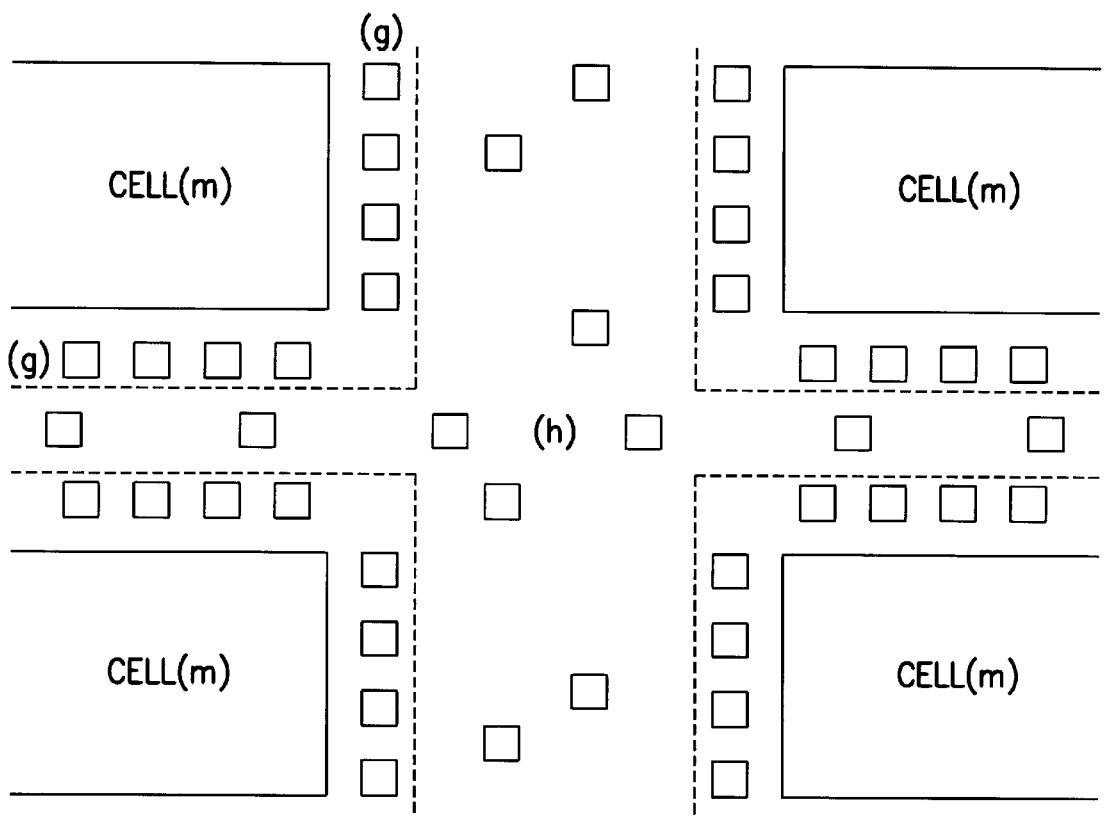
FIG. 8 is a plan view of group A1 in FIG. 7.

FIG. 7 is a cross-sectional view of a DRAM device according to another preferred embodiment of the present invention, and FIG. 8 is a plan view showing a group Al in the DRAM device of FIG. 7.

Referring to FIGS. 7 and 8, in the same way as the above described embodiment, the core region adjacent to the memory cell region (m) is classified as a group A and the peripheral circuit region (R/D, C/D) as a group B, thus differentiating the mask sizing factor of the metal contacts formed at the groups A and B. At the same time, the region of the core region connecting a cell to another cell is subclassified as a group A1 and the remaining core region as a group A2. And by over sizing the first metal contacts (g, g') placed at the area closest to the memory cell region (m) of the group A1, the sizes of the first metal contacts are designed to be larger than those of the remaining metal contacts (h) on the mask. It is preferred that the first metal contacts (g, g') determines the size of the pattern on the mask. For example, if the desired contact size is 500 nm, the size of the pattern is determined as 650 nm which is larger than the above-desired contact size about 150 nm. In the meanwhile, the pattern size of the remaining metal contacts (h) on the mask is determined as 600 nm which is larger than the desired contact size about 100 nm.

If the photolithography for forming the metal contact is executed by using such a mask, the exposure at the group A becomes more intensive than at the group B, and furthermore the exposure at the first metal contact (g, g') region of the group A1 becomes more intensive than at the remaining region (A). Hence, the metal contact can be formed without a contact defect at the first metal contact (g, g') region of the core region (group A1) closest to the memory cell region (m), and practically, the sizes of the metal contacts formed at the memory cell region (m), the core region (groups A1 and A2) and the peripheral circuit region (group B) become uniform on the wafer.

Figure 9:
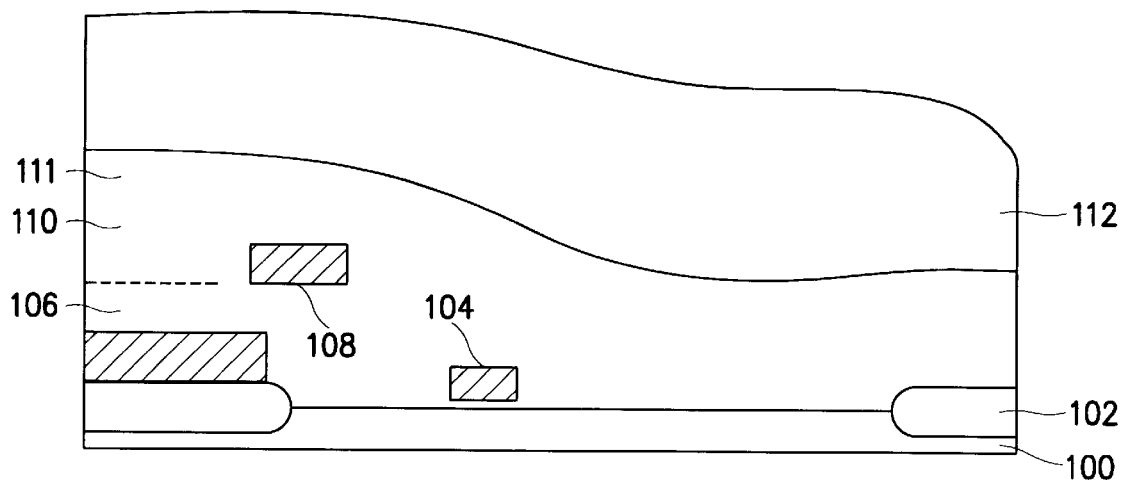
FIGS. 9 and 10 are cross-sectional views for explaining a metal contact forming method of a semiconductor device according to the present invention.
Figure 10:
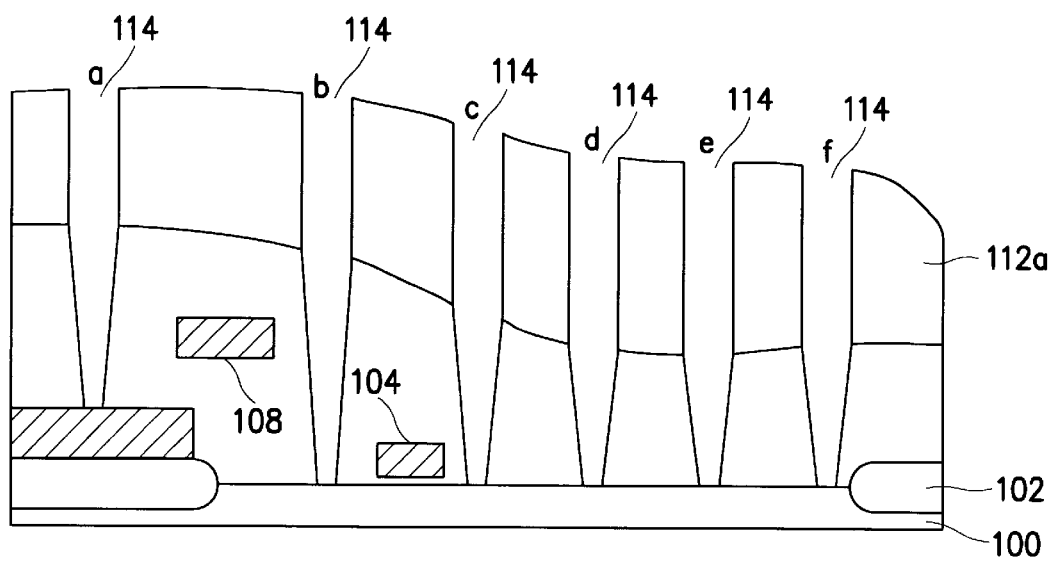

FIGS. 9 and 10 are cross-sectional views for explaining a metal contact forming method of a DRAM device according to the present invention.

FIG. 9 illustrates a step of forming a photoresist 112. A field oxide film 102 is formed on a semiconductor substrate 100 by a known device isolation process, thus dividing the substrate 100 into an active region and a device isolation region. Next, a first conductive layer 104 is deposited over the substrate 100 and patterned by photolithography, thus forming a gate electrode of a transistor acting as a word line. Subsequently, source and drain regions (not shown) of the transistor are formed on the surface of the active region at both sides of the gate electrode by a known ion-implantation and diffusion process.

After a first insulating layer 106 made of insulating material like oxide is formed on the substrate 100 on which the transistor has been formed as described above, the first insulating layer 106 is etched by photolithography, thus forming a bit line contact (not shown) to expose a drain region of the transistor. And then, a second conductive layer 108 is deposited over the first insulating layer 106 containing the bit line contact and patterned by photolithography, thus forming a bit line which is connected to the drain region of the transistor via the bit line contact. A second insulating layer 110 made of liquid insulating material like BPSG is formed over the second conductive layer 108. The second insulating layer 110 serves to insulate the bit line 108 from a storage electrode (not shown) of the transistor which is to be formed in a subsequent process, and for the planarization of the surface of the second insulating layer 110, a flow process, an etch-back process or a chemical mechanical polishing (CMP) process is executed. Though not shown, the storage electrode of the transistor, a dielectric layer and a plate electrode are sequentially formed over the second insulating layer 110. And then a third insulating layer 111 is formed to cover the capacitor. Thereafter, a photoresist 112 is doped over the whole surface of the resultant structure where the capacitor is formed, to form a metal wiring of the active region (i.e., source/drain regions) and conductive layers. In a COB structured DRAM device, a vertical step difference among the memory cell region, the core region and the peripheral circuit region has already been formed due to the word line and the bit line, and thus the step difference of its lower structure cannot be not removed even though the planarization is processed after forming the second insulating layer 110. Hence, the thickness of the photoresist 112 varies by the area of the metal contact, as shown in FIG. 8.

FIG. 10 shows a step of forming photoresist patterns 112a and metal contact holes 114. After doping the photoresist 112 as described above, the photoresist 112 is light-exposed and developed by using the mask discussed in the preferred embodiments of the present invention, thus forming photoresist patterns 112a to open the metal contact regions. Here, since the metal contact patterns on the mask have differentiated mask sizing factors by their areas, the exposure at the area where the size of the metal contact pattern is relatively large is more intensive than at the remaining areas, and thus it is possible to get a good profile of the photoresist at the a, b, c, d, e and f regions on the wafer.

After forming the photoresist patterns 112a as described above, the third, second and first insulating layers 111, 110 and 106 are etched by using the photoresist patterns 112a as an etching mask, to form metal contact holes 114. In the present invention, the mask sizing factors of the metal contacts are differentiated by the area of the metal contact, and thus the critical dimension of the metal contact is not reduced even at the region where there exists a significant global step difference on the wafer. Hence, the metal contacts are formed at the a, b, c, d, e, and f regions on the wafer with a uniform critical dimension.

According to the present invention as described above, to prevent the size of a plurality of adjacent contacts formed on the regions of the same layout from being gradually varied to the range of 100~200 nm or being over 20% of the mean size of the contacts by the global step difference on the wafer, the layout is divided into at least two groups, and the contacts of respective groups are formed by using masks of different sizes. It is preferred that the contacts at the group where there occurs a contact defect significantly are designed to have a larger size than those at the remaining group on the mask. Hence, since even the contacts at the region where the global step difference on the wafer is the greatest, i.e., at the region where the difference of vertical morphology is most significant can be designed to a desired size, it is possible to minimize the problem that the contact is not opened and to enhance the process margin of photolithography.

While this invention has been described in connection with what is presently considered to be the most practical and preferred embodiment, it is to be understood that the invention is not limited to the disclosed embodiment, but, on the contrary, it is intended to cover various modifications within the spirit and scope of the appended claims.

What is claimed is:

1. A method for forming metal contacts in a dynamic random access memory device having a memory cell region, a core region for driving the cells and a peripheral circuit region comprising the steps of:

forming a transistor having a source/drain on a substrate;

forming a first insulating layer over the transistor;

forming a bit line on the first insulating layer;

forming a second insulating layer over the bit line;

forming a capacitor on the second insulating layer;

forming a third insulating layer to cover the capacitor;

forming a first metal contact on the core region using a first contact pattern having a first opening area; and forming a second metal contact having an area equal to that of the first metal contact on the peripheral circuit region that has a vertical step difference with the core region, using a second contact pattern having a second opening area that is less than the first opening area.

2. The method of claim 1 wherein the steps of forming first metal contact and forming second metal contact comprise the steps of:

exposing a photoresist layer on the third insulating layer using the first and second contact patterns;

developing an exposed portion of the photoresist layer; and etching the first, second, and third insulating layers exposed by a developed portion of the photoresist layer.

3. The method of claim 2 further comprising the step of forming a third metal contact on the core region adjacent to the memory cell region using a third contact pattern having a third opening area that is larger than the first opening area.

4. The method of claim 1 further comprising the step of forming a third metal contact on the core region adjacent to the memory cell region using a third contact pattern having a third opening area that is larger than the first opening area.

5. A method of forming contacts in an integrated circuit comprising the step of:

forming a first contact on a first region of the integrated circuit using a first contact pattern having a first opening area; and forming a second contact having an area equal to that of the first metal contact on a second region that has a vertical step difference with the first region, using a second contact pattern having a second opening area that is less than the first opening area.

* * * * *